AUTOMATIC GAIN LEVEL ADJUSTER
Filed Dec. 17, 1962
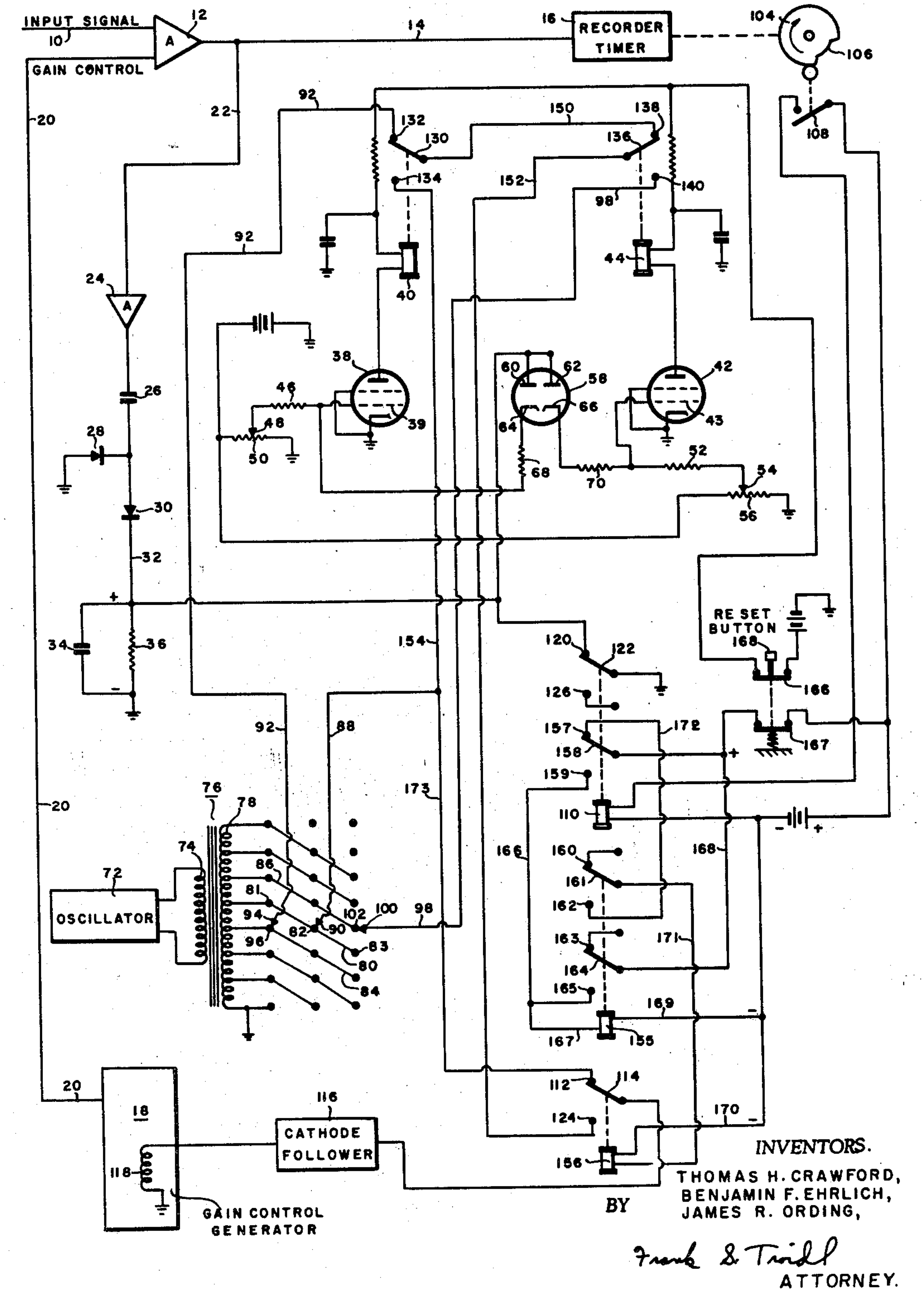
INVENTORS.
THOMAS H. CRAWFORD,
BENJAMIN F. EHRLICH,
JAMES R. ORDING,
BY
Frank S. Triedl
ATTORNEY.

United States Patent Office 3,185,930
Patented May 25, 1965

3,185,930

AUTOMATIC GAIN LEVEL ADJUSTER

Thomas H. Crawford, Benjamin F. Ehrlich, and James R. Ording, Houston, Tex., assignors, by mesne assignments, to Esso Production Research Company, Houston, Tex., a corporation of Delaware Filed Dec. 17, 1962, Ser. No. 245,290
3 Claims. (Cl. 328—175)

This invention relates to the control of the magnitude of signals. More particularly, this invention is a combination of elements for adjusting the gain control signal applied to an input signal circuit when the magnitude of the input signal is outside of a predetermined range.

For certain applications, it is often necessary to apply a particular gain control curve to an input signal circuit. For example, in seismic exploration the recorded seismic signals decrease as a function of time. It is common practice, therefore, to adjust the gain applied to the input signal circuit as a function of time. This adjustment of gain can be accomplished by applying a particular gain control curve. However, if the particular gain control curve initially applied is either too low or too high in magnitude, it becomes necessary to adjust the initial voltage level of the gain control curve. The circuit to be described herein automatically provides for a calibrated adjustment of the gain control curve when the input signal is too low in magnitude or too high in magnitude.

The invention, as well as its many advantages, will be understood by reference to the drawing which shows in a single figure an electrical, schematic diagram of a preferred system for controlling the gain of an input signal.

Referring to the figure, the new system includes a signal input circuit including an input signal line 10 and an amplifier 12. The amplified signals from amplifier 12 are fed through line 14 to the recorder-timer circuit 16 where the input signals are recorded.

The amplitudes of the signals from amplifier 12 are controlled by a gain control signal fed from gain control generator 18 through line 20 to the amplifier 12. For example, the gain control signal through line 20 may be a gain control curve similar to the curve generated from the function generator described and claimed in application Serial No. 233,277 entitled, "Function Generator," filed October 26, 1962, in the names of Crawford et al. With this type of gain control function generator, a suppression voltage which decreases in magnitude as a function of time is fed from gain control generator 18 through line 20 to the amplifier 12. This decreasing magnitude as a function of time causes an increase as a function of time in the over-all gain of the input signals fed through line 10 into amplifier 12.

The output signals from amplifier 12 are also fed through line 22 to an amplifier 24. The amplified signals from amplifier 24 are conducted through capacitor 26 to a rectifying circuit including the voltage doubler arrangement of diodes 28 and 30.

The rectified signals are conducted through line 32 to a parallel arrangement of a capacitor 34 and resistor 36. The capacitor 34 and resistor 36 form a summing circuit. The capacitor receives the rectified signals and charges an amount proportional to the magnitudes of the rectified signals. A circuit for indicating the magnitude of the charge on the capacitor 34 includes a first thyratron 38 controlling a first relay 40 and a second thyratron 42 controlling a second relay 44. The negative bias applied to the grid 39 of thyratron 38 through resistor 46 is controlled by the position of a movable tap 48 along resistor 50. The bias applied to the grid 43 of thyratron 42 through resistor 52 is controlled by the position of a movable tap 54 along the resistor 56.

For simplification, only one input signal circuit including amplifier 12, amplifier 24, and rectifiers 28 and 30 is shown. However, in actual practice it is probably more desirable to include a plurality of such circuits. Then the sums of the rectified voltages are combined in line 32. The use of several channels gives a more representative value of energy. Summing after rectification prevents cancellation due to phase differences of different channels.

An electronic tube 58 including anodes 60 and 62 and cathodes 64 and 66 having resistors 68 and 70, respectively, is connected between the thyratrons 38 and 42. Tube 58 prevents the firing of thyratron 42 from the positive voltage appearing on the grid 39 of thyratron 38 when thyratron 38 fires.

An oscillator 72 supplies an oscillating signal to the primary coil 74 of iron core transformer 76. The secondary coil 78 of iron core transformer 76 includes a plurality of voltage outlets. As shown in the figure, each voltage level from the secondary coil 78 has three outlets. Each voltage level may vary from adjacent voltage levels by, say, 5 db. Each switch, such as switch 80, is adapted to contact three outlets 81, 82, and 83 with the db voltage from all three outlets being the same. The voltage from the outlets connected by switch 84 is, say, 5 db lower than the voltage from the outlets connected by switch 80. The voltage from the outlets connected by switch 86 is, therefore, 5 db higher than the voltage from the outlets connected by switch 80. Therefore, if a particular voltage is fed through line 88 by connecting tap 90 to outlet 82 of switch 80, a voltage of 5 db less than the particular voltage will be conducted through line 92 by the contact of tap 94 with outlet 96; and a voltage of 5 db more than the particular voltage will be conducted through line 98 by the contact of tap 100 with outlet 102.

The recorder-timer circuit 16 controls the operation of a cam 104 having a groove 106. The cam 104 controls the operation of a microswitch 108. The microswitch 108 controls the operation of a relay 110.

In operation, the positions of the microswitch 108 and the relays 40, 44, 110, 155, 156, and their associated contacts are as shown in the figure. The microswitch 108 has not yet fallen into the groove 106 of cam 104. A preselected voltage is being fed through line 88, line 173, relay contact 112, relay switch 114 and the cathode follower 116 to apply a predetermined voltage across a primary coil 118 in the gain control generator 18. The capacitor 34 is grounded through relay contact 120 and relay switch 122.

During the sampling interval, the microswitch 108 falls into grove 106 of cam 104. Relay 110 is energized. Relay contact 158 is moved from contact with contact 157 into contact with 159. Current will flow through lines 166 and 167 through relay coil 155. Relay switch 164 is moved from contact with relay contact 163 into contact with relay contact 165. This makes relay coil 155 a holding relay since current can now flow from the battery through line 168, switch contact 164, relay contact 165, line 167, relay coil 155, and line 169. Also, relay switch 161 moves from relay contact 160 to relay contact 162 and remains.

At the end of the sample interval, microswitch 108 is again opened, thus returning 122 and 158 to the positions shown in the figure. Now current can flow through relay switch 158, relay contact 157, line 172, relay contact 162, relay switch 161, line 171, relay coil 156, and line 170. This moves relay switch 114 from contact with relay contact 112 into contact with relay contact 124.

During the sampling interval, the relay switch 122 is moved from contact with relay contact 120 into contact with relay contact 126. Thus, the sum of the rectified voltages charges capacitor 34. This positive voltage is fed to both thyratrons 38 and 42 through the electronic tube 58. The bias on thyratron 38 is adjusted by means of tap 48 to be a predetermined amount less than the bias on thyratron 42 which is adjusted by means of tap 54.

If the sum of the rectified voltages is sufficient to fire thyratron 38, relay switch 130 is moved from relay contact 132 into contact with relay contact 134. If the sum of the rectified voltages is great enough to fire both thyratrons 38 and 42, the relay switch 136 is moved from relay contact 138 into engagement with relay contact 140. If the sum of the rectified voltages is not great enough to fire either thyratron, the switches 130 and 136 will remain in the positions shown in the figure.

If neither thyratron 38 nor thyratron 42 has fired, voltage will be fed from outlet 96 through line 92, relay contact 132, relay switch 130, line 150, relay contact 138, relay switch 136, line 152, relay contact 124, and at the end of sample time through relay switch 114 to the cathode follower 116 and gain control generator 18. The suppression voltage from gain control generator 18 fed to amplifier 12 through line 20 is thus decreased by 5 db.

If thyratron 38 fires and thyratron 42 does not fire, the predetermined voltage from outlet 82 is fed through line 88, line 154, relay contact 134, relay switch 130, line 150, relay contact 138, relay switch 136, line 152, relay contact 124, and at the end of sample time through relay switch 114 to cathode follower 116 and gain control generator 18. Thus, the suppression voltage remains unchanged.

If both thyratrons 38 and 42 fire, voltage is fed from outlet 102 through line 98, relay contact 140, relay switch 136, line 152, relay contact 124, and at the end of sample time through relay switch 114 to cathode follower 116 and gain control generator 18. Thus, the suppression voltage fed from gain control generator 18 through line 20 to the amplifier 12 is increased by 5 db.

To reset at the end of record time, push button 168 is pressed opening contacts 166 and 167 which allows all relays to assume the positions shown in the figure.

We claim:

1. In combination: a signal input circuit; a recording and timing circuit for receiving the signals from the signal input circuit; a gain control generator; means for conducting a gain control signal from the gain control generator to the signal input circuit; a rectifier connected to the signal input circuit for receiving signals from the signal input circuit; a first and a second normally nonconducting member; switching means including a first switch and a second switch controlled by the first and second normally nonconducting members, respectively; adjustable means for applying different biases to each of said normally nonconducting members; switch controlled means for conducting the rectified signals from the rectifier to said normally nonconducting members; a voltage source; means for providing three different voltages from said voltage source to said switching means; and a conducting line leading from said switching means to the gain control generator, whereby the biases on said normally nonconducting members can be adjusted so that the positions of the first and second switches in said switching means will be such that the proper voltage will be fed to the gain control generator to keep the magnitudes of the input signals fed to the recording and timing circuit within a predetermined magnitude range.

2. The combination of claim 1 wherein the normally nonconducting members are electronic tubes.

3. The combination of claim 2 wherein the electronic tubes are thyratrons.

References Cited by the Examiner

UNITED STATES PATENTS 3,102,983 9/63 Turner ............ 328—171 X

JOHN W. HUCKERT, *Primary Examiner.*

ARTHUR GAUSS, *Examiner.*